United States Patent [19]

Laurent

[11] 4,382,232

[45] May 3, 1983

[54] DEVICE FOR DEMODULATING SIGNALS MODULATED BY FREQUENCY-SHIFT KEYING

[75] Inventor: Pierre Laurent, Paris, France

[73] Assignee: Thomson-CSF, Paris, France

[21] Appl. No.: 292,338

[22] Filed: Aug. 12, 1981

Related U.S. Application Data

[63] Continuation of Ser. No. 55,815, Jul. 9, 1979, abandoned.

[30] Foreign Application Priority Data

Jul. 12, 1978 [FR] France ............................... 78 20809

[51] Int. Cl.³ ............................................. H03K 3/00
[52] U.S. Cl. .................................... 329/117; 333/193
[58] Field of Search ............... 329/117, 118, 137, 195, 329/119, 204; 333/193, 151, 150

[56] References Cited

U.S. PATENT DOCUMENTS

| | | | |
|---|---|---|---|
| 3,522,382 | 7/1970 | Ise | 329/117 |
| 3,691,464 | 9/1972 | Payton et al. | 325/55 |
| 3,736,587 | 5/1973 | Bush et al. | 333/150 |
| 3,835,422 | 9/1974 | Hartemann | 329/117 |
| 3,987,367 | 10/1976 | Hartemann | 329/118 |

OTHER PUBLICATIONS

Collins et al, "Application of Surface Acoustic Wave Devices to Spread Spectrum Communications", Wave Electronics, vol. 6/76, pp. 311-342.

Morgan et al, "Spread Spectrum Synchronizer Using a Saw Convolver and Recirculation Loop", vol. 64, 5/76, pp. 751-753.

Atzeni et al, "Design of Surface Acoustic Wave Filters", Alta Frequenza, 10/10/74, pp. 601E-865 to 611E-875.

*Primary Examiner*—David K. Moore
*Attorney, Agent, or Firm*—Roland Plottel

[57] ABSTRACT

A device for demodulating signals modulated by frequency-shift keying comprises a surface-wave filter having two input transducers supplied in parallel by the modulated signals and separated by a given distance, and an output transducer composed of electrodes $e_1$ to $e_{n+1}$ and $e'_1$ to $e'_{n+1}$. The signals delivered by the electrodes $e'_1$ to $e'_{n+1}$ are applied to the inputs of an algebraic summing device through switches $I_1$ to $I_{n+1}$ controlled by logical signals $T_1$ to $T_{n+1}$. The output of the summing device is connected to the output of the demodulating device through a threshold device; programming of the signals $T_1$ to $T_{n+1}$ makes it possible to provide a filter which is matched with the signals to be demodulated.

10 Claims, 5 Drawing Figures

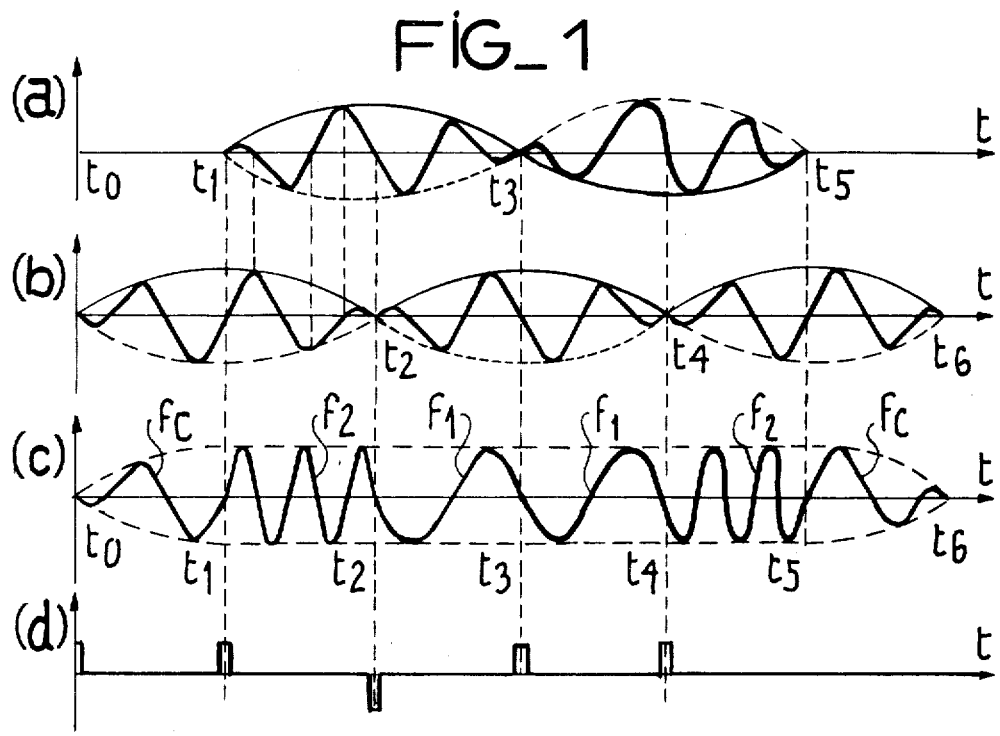
FIG_1
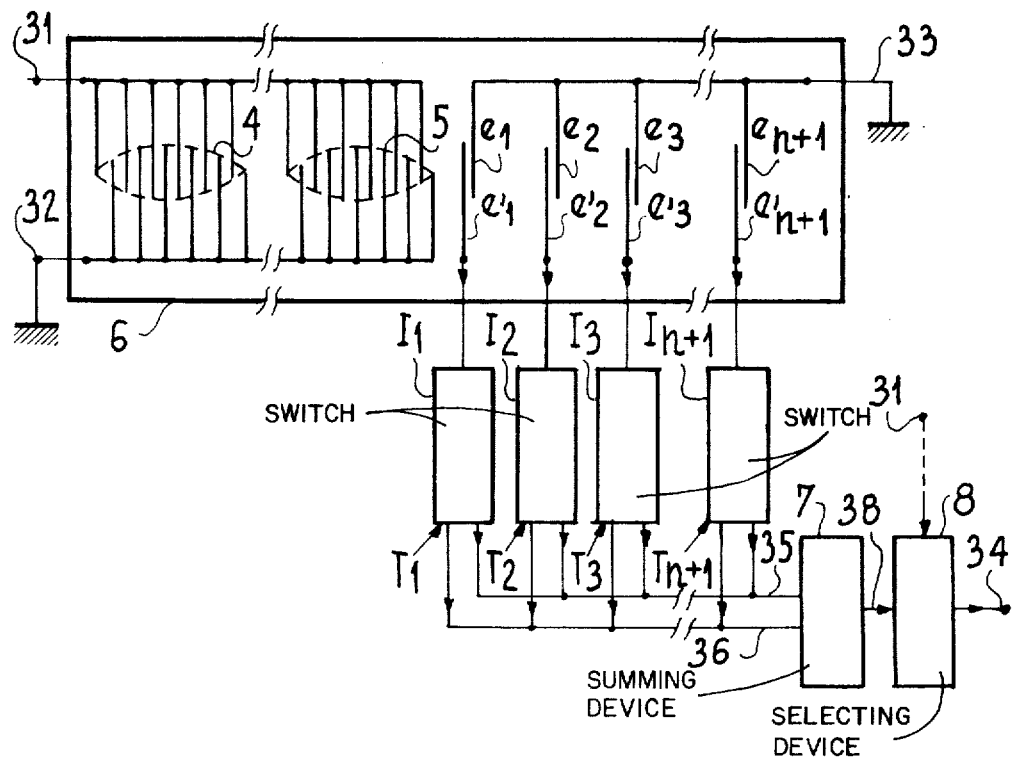
FIG_3

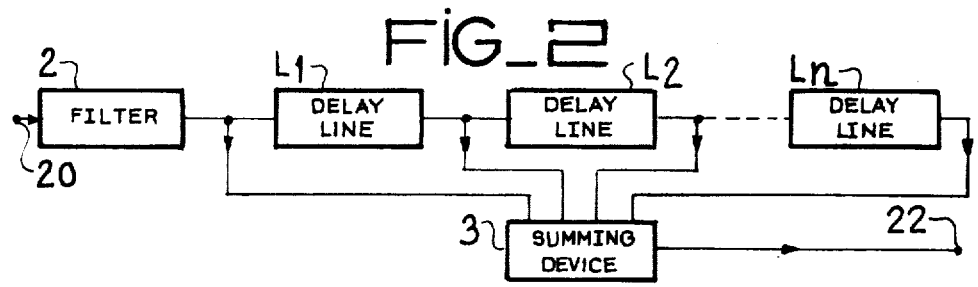
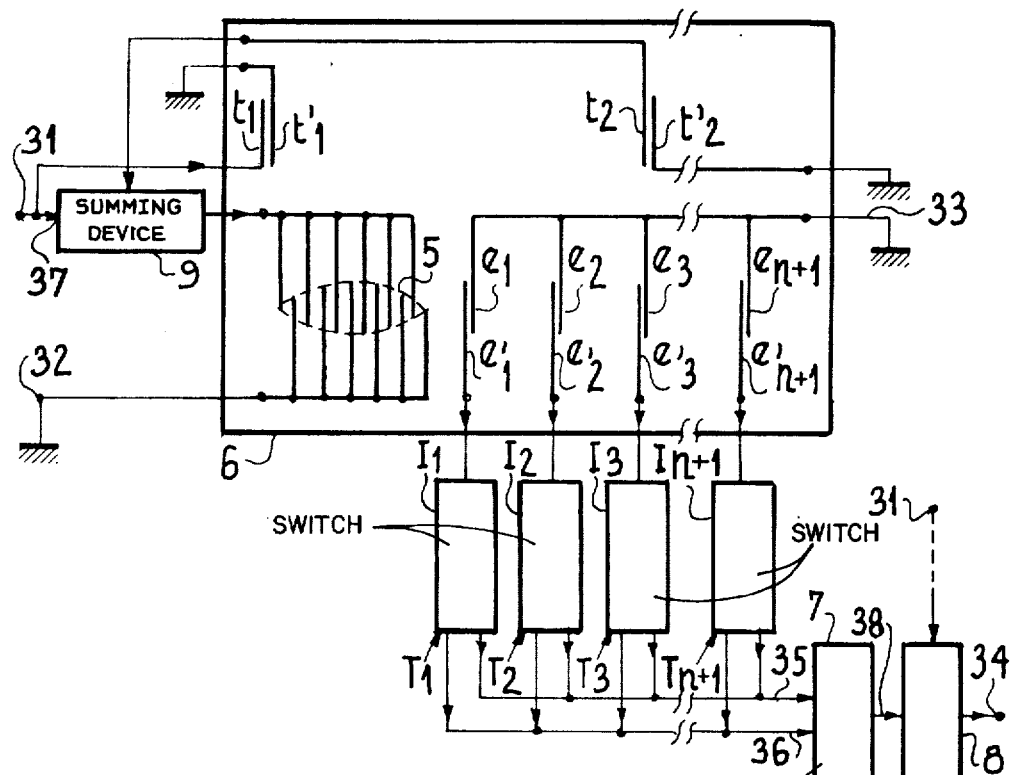
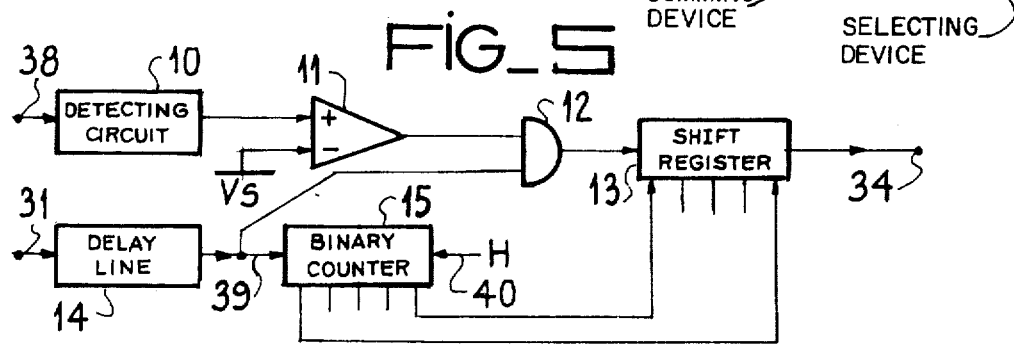

DEVICE FOR DEMODULATING SIGNALS MODULATED BY FREQUENCY-SHIFT KEYING

This application is a continuation, of application Ser. No. 55,815, filed 7/09/79, and now abandoned.

This invention relates to devices for demodulating signals modulated by frequency shift and composed of sequences which are deduced from each other by circular permutations, and especially signals modulated by minimum-spectrum frequency-shift keying.

Modulation by minimum-spectrum frequency-shift keying (MFSK) is a coded two-frequency modulation characterized by a modulated signal having a constant amplitude, a continuous phase shift and a minimum spectrum width. According to certain publications (IEEE Transactions on Communications, April 1977 page 433), this modulation is considered throughout the time-duration of each sequence either as a modulation by frequency-shift of a signal having a frequency $F_c$ (this modulation being known as FSK or frequency-shift keying) in which the resultant modulated signal has two frequencies $$F_1 = F_c - \frac{F_b}{4} \text{ and } F_2 = F_c + \frac{F_b}{4}$$

(where $F_b$ is the frequency of bits transmitted), or as a particular case of quaternary phase shift modulation (known as QPSK or Quaternary Phase Shift Keying).

A signal modulated by minimum-spectrum frequency-shift keying can be obtained by summation of two carriers in phase quadrature and modulated independently of each other by two modulating signals defined as follows:

the interval between two zero points of the amplitude of each of the two modulating signals is equal to $$\frac{2}{F_b} = 2\tau;$$

between these zero points, the modulating signals are constituted by sine-wave half-cycles in which the sign $+1$ or $-1$ of the amplitude is determined by a code;

the zero points of each modulating signal are respectively displaced by $\tau$.

In order to carry out these modulations, the two carriers are respectively multiplied analogically by the two modulating signals. It is worthy of note that, in the case of each modulated carrier, this modulation results in a o or $\pi$ phase modulation each time the amplitude of the modulating signal becomes zero.

In order to construct a device for demodulating signals which have thus been modulated, it is a known practice to employ phase-control demodulators (as described in IEEE Transactions on Communications, October 1973 page 1529) which carry out coherent demodulation on two channels in quadrature. These demodulators are adapted to demodulation of a continuously modulated signal but not to demodulation of a sequence-modulated signal.

The aim of the present invention is to overcome the disadvantages of these demodulators.

According to the invention there is provided a device for demodulating signals modulated by frequency shift, said signals being constituted by sequences of n oscillation trains, n being an integer greater than 1, in which each train has one or the other of two given frequencies $F_1$ and $F_2$ and a given time-duration $\tau$, and the sequences being issued from a base sequence of n oscillation trains by circular permutations of the successive values of frequency of the n trains, said sequences being representative of a binary code with n coded sequences having circular permutations, said demodulating device being provided with an input for receiving said coded sequences, an output and first and second filtering channels matched with one of the sequences of n oscillation trains, said tuning sequence, said filtering channels having respective input channels coupled to the input of said device and a common output channel delivering a response signal for a received sequence, said input channels being time-delayed for producing and increase in the transit time by $n\tau$ in said first filtering channel with respect to the transit time in the second filtering channel, said demodulating device further comprising a detection device having an input coupled to the common output of the filtering channels and an output coupled to the output of said demodulating device, for detecting in the response signal an instant at which said response signal corresponds to said tuning sequence, said instant being characteristic of said received sequence.

A more complete understanding of the invention will be gained from the following description in which further distinctive features will appear, reference being made to the accompanying drawings, wherein:

FIG. 1 represents chronograms of signals and serve to explain the principle of MFSK modulation (modulation by minimum-spectrum frequency-shift keying);

FIG. 2 is a general diagram of a filter matched with a sequence of MFSK signals (modulated by minimum-spectrum frequency-shift keying);

FIG. 3 is a diagram of a first preferred embodiment of the device according to the invention;

FIG. 4 is a diagram of a second preferred embodiment of the device according to the invention;

FIG. 5 is a detail diagram of an element which is common to FIGS. 3 and 4.

Corresponding elements which are identical in the different figures are designated in the drawings by the same reference numerals.

Consider a first signal a resulting from the analog product of a carrier signal having a frequency $F_c$ and of a modulating signal constituted by sine-wave half-cycles having a time-duration $2\tau$, $$f = \frac{1}{4\tau},$$

f being the pseudo-frequency of the modulating signal. The equation of a signal of this type is written as follows: $\epsilon_1 \cos 2\pi F_c t \cdot \sin (\pi/2\tau)t$ (where $\epsilon_1$ is equal to $\pm 1$ and can change in value only at the instants of nullification of the amplitude of the modulating signal). Similarly, consider a second signal b resulting from the analog product of a carrier signal having a frequency $F_c$ 90° out of phase with respect to the first signal and of a modulating signal which is of the same type as the first but the amplitude of which passes to zero at instants displaced by the time interval $\tau$ with respect to the instants of nullification of the amplitude of the first modulating signal. The equation of a signal of this type is written as follows:

$$\epsilon_2 \sin 2\pi F_c t \cdot \cos \frac{\pi}{2\tau} t$$

(where $\epsilon_2$ is equal to $\pm 1$ and can change only at the instants of nullification of the amplitude of the modulating signal).

The sum of the two signals a and b is a signal c, the equation of which is given by the following relation:

$$\epsilon_2 \sin 2\pi \left( F_c + \frac{\epsilon_1}{\epsilon_2} \cdot \frac{1}{4\tau} \right) t \text{ with } \begin{cases} F_c + \frac{1}{4\tau} = F_2 \text{ if } \frac{\epsilon_1}{\epsilon_2} = +1 \\ F_c - \frac{1}{4\tau} = F_1 \text{ if } \frac{\epsilon_1}{\epsilon_2} = -1 \end{cases}$$

This sum signal c is an MSFK signal (modulated by minimum-spectrum frequency-shift keying) which has a continuous phase shift and a constant amplitude. Experience shows and calculation confirms that these characteristics are obtained only on the following condition:

$$\omega_c \cdot \tau = \frac{\pi}{2} + k\pi,$$

k being a positive integer. This relation results, between the frequency $F_c$ and the pseudo-frequency f, in the following relation $F_c = (2k+1)f$.

There is shown in FIG. 1 a signal a which is assumed to exist only between the instants $t_1$ and $t_5$ with $\epsilon_1 = 1$ between the instants $t_1$ and $t_3$ and between the instants $t_3$ and $t_5$ (the modulating signal being represented in the figure by a full line for which the sign of the amplitude does not change at the instant of nullification). It should be noted in addition that $t_5-t_3=t_3-t_1=2\tau$. Said signal b which is assumed to exist only between the instants $t_o$ and $t_6$ is represented in FIG. 1 with:

$\epsilon_2 = 1$ between the instants $t_o$ and $t_2$;

$\epsilon_2 = -1$ between the instants $t_2$ and $t_4$;

$\epsilon_2 = 1$ between the instants $t_4$ and $t_6$ (the modulating signal being represented by a full line with a change of sign at the instant of nullification);

$$\text{and } \frac{t_6 - t_4}{2} = \frac{t_4 - t_2}{2} = \frac{t_2 - t_o}{2} = t_1 - t_o = \tau$$

The sum of these signals a and b is represented by the signal c of FIG. 1. The frequency of said signal c varies as follows from one time interval $\tau$ to the next:

between the instants $t_o$ and $t_1$: frequency $F_c$ (non-significant portion of the message)

between the instants $t_1$ and $t_2$: frequency $F_2$ since $$\frac{\epsilon_1}{\epsilon_2} = 1$$

between the instants $t_2$ and $t_3$: frequency $F_1$ since $$\frac{\epsilon_1}{\epsilon_2} = -1$$

between the instants $t_3$ and $t_4$: frequency $F_1$ since $$\frac{\epsilon_1}{\epsilon_2} = -1$$

between the instants $t_4$ and $t_5$: frequency $F_2$ since $$\frac{\epsilon_1}{\epsilon_2} = +1$$

between the instants $t_5$ and $t_6$: frequency $F_c$ (non-significant portion of the message)

It should further be observed that, in the equations of signals a and b mentioned above, the phase difference between the carrier signal and the modulating signal with respect to the zero value is $\pi/4$ (particular case of FIG. 1) but it should be noted that this phase difference can assume any value.

The synthesis of a signal such as c can also be achieved by means of a filter having a pulse response in the form of the train of oscillations of frequency $F_c$ of the signal a considered between the instants $t_1$ and $t_3$, there being applied to the input of said filter the signal d of FIG. 1 which is constituted by $n+1$ short pulses having a period $\tau$.

The conditions required in order to obtain the frequencies $F_1$ and $F_2$ are accordingly as follows:

frequency $F_2$ if the last two consecutive pulses are of the same sign;

frequency $F_1$ if the last two consecutive pulses are of opposite sign.

In fact, between the instants $t_1$ and $t_5$, the signal c represents a modulated two-frequency signal in which the two values of frequency $F_1$ and $F_2$ can be employed for representing a circular-permutation binary code.

The circular-permutation binary coding of a first item of information is usually represented by a first sequence having n bits in which the bits are ordered in a predetermined manner, this sequence being designated hereinafter as a "base sequence" and being separated from the following sequence by an absence of signal during a given time interval (0011 an example of a base sequence).

The other sequences comprising the following items of information or data and separated from each other by an absence of signal are obtained by circular permutations of the base sequence (1001, 1100 and 0110 the other sequences in the above example). This sequence modulation is a particular case of "n-area modulation", where n is the number of circular permutations employed.

Each sequence of n bits (4 in the above example) corresponds to a unitary item of information or datum to be transmitted (such as a letter of the alphabet, for example). In consequence, a "base sequence" which is such that the n sequences deduced from each other by circular permutation are not identical makes it possible to transmit n different unitary data (a base sequence 0101 is not convenient because circular permutations give twice a same code).

It is assumed hereinafter that the signals to be demodulated have been obtained in accordance with the method described above by means of a filter having a pulse response consisting of the train of oscillations of the signal a as considered between the instants $t_1$ and $t_3$. This filter will be designated hereinafter as an "emission filter", the bits 0 and 1 are coded by oscillation trains having respective frequencies $F_1$ and $F_2$. For instance, the signal (c) of FIG. 1 codes a sequence of bits 1001, obtained from the base sequence 0011 (example above), and can be generated with a sequence of 5 pulses having a period $\tau$, respectively positive, positive, negative, positive and positive (signal (d) of FIG. 1).

Demodulation of said signals coded by permutations of a base sequence modulated by frequency shift is intended to restitute a pulse in which the position in time within a time interval $n.\tau$ is a function of the information received.

In order to identify a sequence having a known code, experience shows and calculation confirms that it is only necessary to employ a demodulator consisting of a filter which is matched with said sequence. In this context and in the appended claims, a filter matched with a train of oscillations having a frequency $F_c$ or with a sequence as hereinabove defined is intended to designate a filter having a pulse response which is the inverse in time of the train or of the sequence, taking no account of the phase at the origin of the carrier frequency. A filter matched with a signal of finite duration is such that the pulse response is the same signal invert in time.

The principle of a matched filter of this type will be explained with reference to the following figure.

In FIG. 2, a filter 2 which receives the sequence having a known code of n bits at its input 20 supplies at its output 21 n delay lines $L_1$ to $L_n$ mounted in series and each imposing a time-delay equal to $\tau$. The output 21 of the filter 2 as well as the output of each delay line $L_1$ to $L_n$ are connected respectively to the $n+1$ inputs of a summing device 3, the output 22 of which constitutes the output of the matched filter. It is worthy of note that each input of the summing device 3 may or may not reverse the signal applied thereto in order to realize the filter which is matched with the sequence having a known code.

The operation of this device is as follows:

The filter 2 has a pulse response in the form of a train of oscillations having a frequency $F_c$ (designated hereinafter as a "base signal") similar to signal a of FIG. 1 as considered between the instants $t_1$ and $t_3$. It is apparent from the foregoing that, since the envelope of the amplitude modulation of the base signal is symmetrical in time, the filter 2 is a filter which is matched with said base signal. A point worthy of note is that the filters 2 of the demodulator and the emission filter must have characteristics as close as possible and, for instance, when these filters are acoustic waves filters, must be formed simultaneously by means of the same masks (in monolithic integration), in order to ensure that an accidental dissymmetry of the emission filter is reproduced on the filter 2. The filter 2 which receives the sequence to be identified delivers a signal which is reproduced at the output of each delay line $L_1$ to $L_n$ with respective time-delays having values from $\tau$ to $n\tau$. The output signals of the filter and of the delay lines are summated algebraically by means of the summing device 3. This algebraic summation is performed in accordance with a code time-inverted in relation to the sign of the pulses generating the sequence, (for example a code which is the inverse in time of the code of signal d of FIG. 1 if the sequence received is the signal (c). This demodulator therefore constitutes a filter which is matched with said sequence to be identified.

It has been shown by experience and confirmed by calculation that the output signal of a filter matched with a given sequence exhibits with respect to said sequence an amplitude peak of higher value than the amplitude peaks which it is capable of exhibiting in the case of the other sequences of the same code.

The principle of the demodulator in accordance with the invention consists in incorporating with a filter matched with a so-called "tuning sequence" (normally the "base sequence") a device for repetition of the received sequence at one point or another of said filter in order to obtain from the demodulator, in respect of one sequence received, a response which is the same as if said demodulator had received the sequence twice in succession. Because of the circular permutations coding, in the sequence formed by twice the sequence received, it is possible to detect the response associated to the tuning sequence, the filter being adapted to this tuning sequences, the instant at which the corresponding peak will appear will be a function of the sequence received. If the received sequence corresponds to the coded sequence 1001 and if the base sequence to which the filter is matched is 0011, the response associated to the tuning sequence appears in the total response at a given instant corresponding to the instant at which the base sequence appears in the sequence formed by two coded sequences: 10011001.

In a first embodiment illustrated in FIG. 3, use is made of a surface acoustic wave filter comprising two input transducers coupled to a single output transducer; each input transducer forms with the output transducer a filter such as the filter 2 of FIG. 2.

In FIG. 3, a piezoelectric substrate 6 of quartz comprises a first set of parallel metal electrodes having different lengths and supplied in parallel by the signal applied to the input 31. Said substrate 6 further comprises a second set of metal electrodes which are parallel to each other, which are parallel to the electrodes of the first set and have different lengths; one end of each electrode is connected to the input 32 through a common connection whilst the input 32 is in turn connected to ground. These two sets of electrodes are interlaced and their zone of interpenetration is indicated by the dashed outline 4 (corresponding to the waveform of the pulse response of the filter). The substrate 6 is also provided with a third and a fourth set of electrodes which are identical and parallel with the other sets mentioned above and also connected to the inputs 31 and 32 (having an interpenetration outline 5). Said third and fourth sets are relatively displaced from the previous sets by a given distance corresponding to the propagation time $T = n\tau$ of the surface acoustic wave within the substrate 6.

The substrate 6 is provided with a fifth set of metal electrodes $e_1$ to $e_{n+1}$ which are parallel to each other, parallel to the electrodes of the second set, and have equal lengths. One end of each electrode is connected to the output 33 through a common connection whilst the output 33 is in turn connected to ground. Said substrate further comprises a sixth set of metal electrodes $e'_1$ to $e'_{n+1}$ which all have the same length, are parallel to each other and parallel to the electrodes of the fifth set. Said fifth and sixth sets of electrodes are interlaced, the electrodes $e'_1$ to $e'_{n+1}$ of these sets being respectively very close to the electrodes $e_1$ to $e_{n+1}$ but spaced with respect to each other by a given distance $l_1$ such that $$l_1 = e'_{n+1} - e'_n = e_{n+1} - e_n = \ldots =$$

$$e_3 - e_2 = e_2 - e_1 = e'_2 - e'_1.$$

The notation $e_{j+1}-e_j$ or $e'_{j+1}$ means that consideration is given to the distance between these electrodes. This given distance corresponds to a propagation time equal to $\tau$ (where $\tau$ is the time-delay mentioned above in the description relating to FIG. 2) of a surface acoustic wave having a frequency $F_c$ which propagates from one pair of electrodes $e_j$, $e'_j$ to the following pair of electrodes $e_{j+1}$, $e'_{j+1}$. Those ends of the electrodes $e'_1$ to $e'_{n+1}$ which are not located opposite to the electrodes $e_1$ to $e_n$ are connected respectively to the inputs of the switches $I_1$ to $I_{n+1}$, said switches being controlled respectively by states of logical signals $T_1$ to $T_{n+1}$. A first output of said switches is connected to a positive input 35 of an algebraic summing device 7 and a second output is connected to a negative input 36 of said summing device 7, an output terminal 38 of which is connected to the output 34 of the device through a selection device 8 controlled by the signal applied to the input 31.

The logical signals $T_1$ to $T_{n+1}$ serve to control the switches $I_1$ to $I_{n+1}$ in order to connect the electrodes $e'_1$ to $e'_{n+1}$ respectively to the input 35 if their logical state is in state "1" and to the input 36 if their logical state is in state "0".

Said demodulation device has been designed for a frequency $F_c$ to 68.75 MHz, a value of $\tau$ of 200 ns and in which $n=32$.

The operation of this device is as follows.

The complete assembly comprising the first and second sets of electrodes constitutes an input transducer which, by piezoelectric effect, converts the electrical signals applied to the input 31 to a surface acoustic wave having a shape which is identical with the electrical response of said transducer. The complete assembly comprising the third and fourth sets of electrodes constitutes an output transducer which receives said wave and converts this latter to an electrical signal by inverse piezoelectric effect (Proceedings of the IEEE, May 1976, Vol. 64, No 5, pages 581 to 595), the waveform of said signal being identical with that of the surface acoustic wave.

Furthermore, the assembly comprising the first and second sets of electrodes as well as the assembly comprising the third and fourth sets of electrodes each constitute a filter, the pulse response of which is a train of oscillations having a frequency $F_c$, the envelope of which is given by the periphery 4 of FIG. 3 (Proceedings of the IEEE, May 1976, Vol. 64, No 5, pages 639 to 651). These assemblies therefore constitute respectively two filters such as the filter 2 of FIG. 2 and the distance between the inputs makes it possible to repeat the sequence received.

Similarly, the assembly comprising the third and fourth sets of electrodes is identical with a delay line designed to give n elementary time delays having a value $\tau$. This delay line is therefore identical with the n delay lines of FIG. 2.

The switches $I_1$ to $I_{n+1}$ serve to perform the coding of this portion of the demodulator according to the inverse in time of signs of the pulses generating the tuning sequence which will be designated hereinafter as the "tuning code" (this coding operation was performed by the inputs of the summing device 3 of FIG. 2 in the case of a fixed and known code). For a tuning sequence 0011 which is generated by a succession of five pulses respectively positive, negative and positive (3 times), the tuning code is such that the switches $I_1$ to $I_5$ are connected to the "+" input of the summing device except $I_2$ which is connected to the "−" input.

The operation of this device is as follows.

Coding of the demodulator (in "tuning code") is carried out by the logical state of the signals $T_1$ to $T_{n+1}$.

When the input 31 receives at an instant $t'$ a sequence which is deduced from the base sequence by circular permutations and corresponds to a given item of information, this sequence is transferred from the input transducer having the interpenetration periphery 5 to the $n+1$ last pairs of electrodes $e_1$, $e'_1$ to $e_{n+1}$, $e'_{n+1}$ of the output transducer with a time delay $\theta$ (where $\theta$ is the time of propagation within the substrate 6 between the input and output transducers). As a general rule, the peak amplitude will not yet be obtained by reason of the non-coincidence of the received sequence with the tuning sequence (filter not matched with the received sequence). The sequence received by the input transducer having the interpenetration periphery 4 will be delivered to the electrodes of the output transducer progressively as the sequence delivered by the preceding input transducer (having the interpenetration periphery 5) leaves the electrodes of the output transducer by reason of the fact that the distance between the two input transducers corresponds to a time delay $T=n\tau$. At a given instant, the sequence which is present on the electrodes of the output transducer and results from the sum of the partial data derived from the two input transducers will coincide with the response of the tuning sequence; the aforementioned peak amplitude will appear at this instant at the output of the summing device. The data then continue to propagate from one pair of electrodes to the next. It should be noted that the time of propagation of data on these pairs of electrodes during which the output of the algebraic summing device 7 is capable of delivering a signal is 3 $n\tau$.

It should further be noted that said peak amplitude will usually be accompanied by two peak values of lower or equal amplitude, these peak values being due to the fact that the information contained on the electrodes of the output transducer coincides to a partial extent with the response for the "tuning sequence". These two peak values will be located temporarily on each side of the peak amplitude. Hence the need for a device which makes it possible to select the peak amplitude such that the position in time of the peak represents the useful information contained in the sequence received. This peak amplitude can be obtained only between the instants $t'+n\tau+\theta$ and $t'+2n\tau+\theta$ if $t'$ is the initial instant of reception (corresponding to the instant $t_1$ of the signal c of FIG. 1) of the sequence. In the foregoing, it has been assumed that the portions of the signal corresponding to those of the signal c of FIG. 1 and located on the one hand between the instant $t_0$ and $t_1$ and on the other hand between the instants $t_5$ and $t_6$ have been suppressed at the time of emission (by means of a controlled switch mounted in series on the signal line).

The device for selecting and utilizing the peak amplitude is the selecting device 8 of FIG. 3 which will be studied in detail with reference of FIG. 5.

It is worthy of note that the tuning sequence is not necessarily the "base sequence" and that, should it not be desired to have the possibility of modifying the "tuning sequence", the switches $I_1$ to $I_{n+1}$ can be dispensed with and the algebraic summing device 7 can be replaced by a simple adding device. In this case, coding of the demodulator is carried out at the level of the output transducer by placing the electrodes $e_i$ ($1 \leq i \leq n+1$) upstream or downstream of the corresponding electrodes $e'_i$ (with respect to the direction of propagation of the surface acoustic wave), depending on whether weighting either by +1 or by −1 is desired.

In a second embodiment illustrated in FIG. 4, the repetition device is placed upstream of a filter such as the filter 2 of FIG. 2.

In FIG. 4, a first input 37 of a summing device 9 is connected to an electrode $t_1$ and to the input 31 of the demodulating device. A second input of said summing device 9 is connected to an electrode $t_2$ and its output is connected to an input transducer which is identical with that of FIG. 3 (interpenetration periphery 5). A pair of electrodes $t_1$, $t'_1$ ($t'_1$ being very close to the electrode $t_1$ and being connected to ground) is associated with a pair of electrodes $t_2$, $t'_2$ ($t'_2$ being very close to the electrode $t_2$ and being connected to ground). The distance between these pairs of electrodes constitutes a delay line which subjects the signal received at the input 31 to a time-delay equal to $T = n\tau$ (namely the same time delay as that of FIG. 3). The electrodes $e_1$ to $e_{n+1}$ and $e'_1$ to $e'_{n+1}$, the switches $I_1$ to $I_{n+1}$, the algebraic summing device 7, the selecting device 8 as well as the substrate 6 are identical with those of FIG. 3 and connected to each other in the same manner.

The operation of this device is deduced from the operation of the device shown in FIG. 3.

In fact, when a sequence is applied to the input 31 at an instant $t'$, this sequence is transferred to the first pair of electrodes of the output transducer with a time delay $\theta$ (where $\theta$ is the time of propagation within the substrate 6 between the input and output transducers). A second sequence which is identical with the first but has a time lag $T = n\tau$ will be progressively applied to the electrodes of the output transducer as in the device of FIG. 3 (by reason of the delay line constituted by the pairs of electrodes $t_1$, $t'_1$ and $t_2$, $t'_2$ and by the summing device 9).

The detail diagram of the selecting device 8 shown in FIGS. 3 and 4 is provided by the following figure.

In FIG. 5, the positive input of an analog comparator 11 is connected to the terminal 38 through a detecting circuit 10. The negative input of said comparator 11 is connected to a threshold voltage $V_S$, and the output of the comparator 11 is connected to a first input of an AND-gate 12, a second input of which is connected to the output of a delay line 14. The output of the AND-gate 12 is connected to a "clock" input of a shift register 13 having m stages, m being such that $2^m \geq /n-$ and having an output 34 which constitutes the output of the device. A clock signal H having a period $\tau$ is applied to an input 40 of a binary counter 15 having five stages and comprising an input 39 connected to the input 31 to which the signal to be demodulated is applied via the delay line 14 which subjects said signal to a time delay $t = n\tau + \theta$. The outputs of the m stages of the counter 15 are connected respectively to the five inputs of the five stages of the shift register 13. For $n = 32$, $m = 5$.

The operation of this device is as follows.

The signal received by the detection circuit 10 is the output signal of the algebraic summing device 7 (shown in FIGS. 3 and 4). This signal which has been described earlier with reference to FIG. 3 has a time-duration of $3n\tau$ (since the beginning and end of the received sequence does not have any signal at the frequency $F_c$) and comprises the useful peak amplitude between the instants $t' + n\tau + \theta$ and $t' + 2n\tau + \theta$ if $t'$ is the beginning of reception of the sequence. The detection circuit 10 and its associated low-pass filter (not shown) serves to deliver to the positive input of the comparator 11 the positive envelope curve of the signal applied to the terminal 38.

The comparator 11 delivers at its output a logical state "1" when the amplitude of the signal applied to its positive input is of higher value than the threshold voltage $V_S$ and a logical state "0" in the event of the contrary. The output signal of said comparator 11 can therefore be in state "1" for the useful peak amplitude but also for the two amplitude peaks which are located in the first and in the last third of the time interval $3n\tau$ of the signal applied to the terminal 38. The delay line 14 and the counter 15 associated with the AND-gate 12 serve to select the useful peak amplitude.

The output signal of the delay line (therefore on the second input of the AND-gate 12 and on the input 39 of the counter 15) is in the logical state "1" at the instant $t' + n\tau + \theta$. This logical state "1" releases the counter 15 which counts from 0 to 31 during a time interval $n\tau$ (duration of the received sequence) at the same rate as its clock which has a period $\tau$ and makes it possible to open the AND-gate 12 and thus to select the useful peak amplitude. The output signal of the AND-gate 12 is therefore in the logical state "1" during the counting period $\tau$ corresponding to the position in time of the useful peak amplitude. This logical state "1" then enables the shift register 13 to record the state of the counter. The contents of said register are then read in serial form at its output 34.

The invention is not limited to the embodiments hereinbefore described with reference to the accompanying drawings. In particular, the following alternative forms of construction may be contemplated for the demodulating devices according to the invention.

the peripheries 4 and 5 of the interpenetration zones of the first and second sets of electrodes are identical with the signal a (of FIG. 1) considered between the instants $t_1$ and $t_3$ but with an envelope curve which is no longer constituted by a sine-wave half-cycle but by a full wave of a quasi-sinusoidal signal having continuous derivatives up to an indeterminate order if such is the case for the emission filter.

The delay lines which impose a time delay $T = n\tau$ on the input signal are delay lines comprising a charge-coupled device.

In another form of construction, the substrate 6 can be lithium niobate or any other material having piezoelectric properties.

Demodulating devices of this type are especially suited for use in coded analog or digital data transfer systems.

What is claimed is:

1. A device for demodulating signals modulated by frequency shift, said signals being constituted by sequences of n oscillation trains, n being an integer greater than 1, in which each train has one or the other of two given frequencies $F_1$ and $F_2$ and a given time-duration $\tau$, and the sequences being issued from a base sequence of n oscillation trains by circular permutations of the successive values of frequency of the n trains, said sequences being representative of a binary code with n coded sequences having circular permutations, said demodulating device being provided with an input for receiving said coded sequences, an output and first and second filtering channels matched with one of the sequences of n oscillation trains which is called tuning sequence, said filtering channels having respective input channels coupled to the input of said device and a common output channel delivering a response signal for a received sequence, said input channels being time-delayed for producing an increase in the transit time by $n\tau$ in said first filtering channel with respect to the transit time in the second filtering channel, said demodulating device further comprising a detection device having an input coupled to the common output of the filtering channels and an output which is the output of said demodulating device, for detecting in the response signal an instant at which said response signal corresponds to said tuning sequence, said instant being characteristic of said received sequence.

2. A demodulating device as claimed in claim 1 wherein said input channels comprise respective filter having a pulse response in the form of a train of amplitude modulated oscillations having a frequency $$F_c = \frac{F_1 + F_2}{2}$$

and a duration $2\tau$, said filter having respective inputs connected to the input of the device and respective outputs, the first input channel further comprising a delay device, with a delay equal to $n\tau$, having an input coupled to the output of the first filter and an output, the output of said second filter and the output of said delay device being coupled to a common output of said input channels which is coupled to said common output channel.

3. A demodulating device as claimed in claim 2 wherein said filters. are surface acoustic wave filters formed on a piezoelectric substrate, said filters comprising respective input transducers having two sets of interlaced electrodes defining said pulse response, and a common output transducer comprising two sets of $(n+1)$ electrodes respectively associated by pairs, said input transducers being separated by a distance corresponding to a time of propagation of the surface waves equal to $n\tau$ thus forming said delay device, and said successives pairs of electrodes being separated by a distance corresponding to a time of propagation of the surface waves equal to $\tau$, thus forming n delay devices with delay $\tau$ in the common output channel, the electrodes of one set being connected to a common terminal and the electrodes of the other set forming $(n+1)$ outputs of said output channel.

4. A demodulating device as claimed in claim 1, wherein said first input channel comprises a delay device with a delay equal to $n\tau$ having an input coupled to the input of said device and an output, said input channels comprising an adding device having two inputs respectively coupled to the input and to the output of said delay device, and an output, and a common filter having an input coupled to the output of said adding device and an output coupled to said common output channel, said filter having a pulse response in the form of a train of amplitude modulated oscillations having a frequency $$F_c = \frac{F_1 + F_2}{2}$$

and a duration $2\tau$.

5. A demodulating device as claimed in claim 4 wherein said delay device and said filter are formed on a piezoelectric substrate, said filter comprising an input transducer having two sets of interlaced electrodes defining said pulse response, and an output transducer comprising two sets of $(n+1)$ electrodes respectively associated by pairs, said successive pairs being separated by a distance corresponding to a time of propagation of the surface waves equal to $\tau$, thus forming n delay devices with delay $\tau$ in the common output channel, the electrodes of one set being connected to a common terminal and the electrodes of the other set forming $(n+1)$ outputs of said output channel.

6. A demodulating device as claimed in one of claims 3, or 5, wherein, in the succession of electrodes of the output transducer, the electrodes of one set are placed alternately one by one with the electrodes, of the other set, said detection device comprising $(n+1)$ electronic switches having input respectively connected to the $(n+1)$ outputs of said output channel respective control inputs and respective outputs, and an algebraic summing device having one positive input, one negative input and one output, said switches coupling respectively the $(n+1)$ outputs of said output channel either to the positive input or to the negative input of the summing device, according to control signals related to said tuning sequence.

7. A demodulating device as claim in one of claim 3, or 5, wherein the respective positions of the electrodes forming a pair in the output transducer is predetermined according to said tuning sequence, said detection device comprising a summing device having $(n+1)$ inputs coupled to the $(n+1)$ outputs of said output channel and one output.

8. A demodulating device as claimed in claim 6, wherein said detection device further comprises a selecting device inserted between the output of the summing device and the output of the demodulating device, said selecting device comprising amplitude selection means and time measuring means for selecting a peak value at the output of said summing device and measuring the duration between the peak appearance and the beginning of the corresponding received sequence.

9. A demodulating device as claimed in claim 7, wherein said detection device further comprises a selecting device inserted between the output of the summing device and the output of the demodulating device, said selecting device comprising amplitude selection means and time measuring means for selecting a peak value at the output of said summing device and measuring the duration between the peak appearance and the beginning of the corresponding received sequence.

10. A demodulating device as defined in claim 7, wherein the delay device is a charged-coupled device.

* * * * *